US011069490B2

(12) United States Patent
Dimberg et al.

(10) Patent No.: US 11,069,490 B2
(45) Date of Patent: Jul. 20, 2021

(54) SELF-ADJUSTING FRAME FOR MOUNTING OVER A WALL-MOUNTED ELECTRICAL DEVICE

(71) Applicant: Lutron Technology Company LLC, Coopersburg, PA (US)

(72) Inventors: Chris Dimberg, Easton, PA (US); Matthew Philip McDonald, Phoenixville, PA (US)

(73) Assignee: Lutron Technology Company, LLC, Coopersburg, PA (US)

( * ) Notice: Subject to any disclaimer, the term of this patent is extended or adjusted under 35 U.S.C. 154(b) by 18 days.

(21) Appl. No.: 16/530,474

(22) Filed: Aug. 2, 2019

(65) Prior Publication Data

US 2019/0355530 A1 Nov. 21, 2019

Related U.S. Application Data

(63) Continuation of application No. 15/468,661, filed on Mar. 24, 2017, now Pat. No. 10,410,802.

(Continued)

(51) Int. Cl.
*H01H 9/02* (2006.01)
*H01H 9/28* (2006.01)
(Continued)

(52) U.S. Cl.
CPC ............ *H01H 9/0207* (2013.01); *H01H 9/02* (2013.01); *H01H 9/0235* (2013.01); *H01H 9/287* (2013.01); *H01H 11/00* (2013.01); *H01H 23/16* (2013.01); *H02G 3/14* (2013.01); *H03K 17/962* (2013.01); *H05B 45/00* (2020.01); *H05B 47/10* (2020.01); *H05B 47/19* (2020.01); *H01H 9/025* (2013.01); *H01H 2223/034* (2013.01); *H01H 2300/03* (2013.01); *Y02B 90/20* (2013.01); *Y04S 20/14* (2013.01)

(58) Field of Classification Search
USPC .......................................................... 307/53
See application file for complete search history.

(56) References Cited

U.S. PATENT DOCUMENTS 4,504,698 A 3/1985 Greenwood
4,835,343 A 5/1989 Graef et al.
(Continued)

FOREIGN PATENT DOCUMENTS

CN 2596671 Y 12/2003

*Primary Examiner* — Rexford N Barnie
*Assistant Examiner* — Xuan Ly
(74) *Attorney, Agent, or Firm* — Flaster Greenberg P.C

(57) ABSTRACT

A mounting frame may be configured as a self-adjusting mounting frame that biases itself against a surface of structure. The mounting frame may be a component, for example, of a remote control device or a faceplate assembly. The mounting frame may be configured to bias a rear surface of the mounting frame against the surface of a structure. The mounting frame may include biasing members. Each biasing member may include an attachment portion and a pair of resilient spring arms that suspend the attachment portion relative to a perimeter wall of the mounting frame such that the attachment portion is spaced further from the rear surface of the mounting frame than locations where the spring arms extend from the mounting frame. The rear surface of the mounting frame may be defined by the perimeter wall.

18 Claims, 9 Drawing Sheets

Related U.S. Application Data

(60) Provisional application No. 62/312,863, filed on Mar. 24, 2016.

(51) Int. Cl.

| | | |
|---|---|---|
| *H02G 3/14* | (2006.01) | |
| *H05B 45/00* | (2020.01) | |
| *H05B 47/10* | (2020.01) | |
| *H05B 47/19* | (2020.01) | |
| *H01H 11/00* | (2006.01) | |
| *H01H 23/16* | (2006.01) | |
| *H03K 17/96* | (2006.01) | |

(56) References Cited

U.S. PATENT DOCUMENTS

| | | |
|---|---|---|
| 4,998,635 A | 3/1991 | Vink et al. |
| 5,180,886 A | 1/1993 | Dierenbach et al. |
| 5,264,761 A | 11/1993 | Johnson |
| 5,458,311 A | 10/1995 | Holbrook |
| 6,566,602 B1 * | 5/2003 | Miller ............ H02G 3/121 174/66 |
| 7,910,849 B2 | 3/2011 | Hibshman et al. |
| 8,389,857 B2 | 3/2013 | Petrillo |
| 9,208,965 B2 * | 12/2015 | Busby ............ H01H 9/287 |
| 9,418,802 B2 | 8/2016 | Romano et al. |
| 9,520,247 B1 | 12/2016 | Finnegan et al. |
| 9,583,288 B2 | 2/2017 | Jones et al. |
| 9,799,469 B2 | 10/2017 | Bailey et al. |
| 9,959,997 B2 | 5/2018 | Bailey et al. |
| 2008/0111491 A1 | 5/2008 | Spira |
| 2012/0292174 A1 | 11/2012 | Mah et al. |
| 2014/0117871 A1 | 5/2014 | Swatsky et al. |
| 2015/0077021 A1 | 3/2015 | Smith et al. |
| 2015/0371534 A1 | 12/2015 | Dimberg et al. |
| 2016/0013626 A1 | 1/2016 | Gage |
| 2016/0073479 A1 | 3/2016 | Erchak et al. |
| 2017/0105176 A1 | 4/2017 | Finnegan et al. |
| 2017/0288350 A1 | 10/2017 | Andersen et al. |
| 2018/0190451 A1 | 7/2018 | Scruggs |

* cited by examiner

SELF-ADJUSTING FRAME FOR MOUNTING OVER A WALL-MOUNTED ELECTRICAL DEVICE

CROSS REFERENCE TO RELATED APPLICATIONS

This application is a continuation of U.S. application Ser. No. 15/468,661, filed Mar. 24, 2017, which claims the benefit of provisional U.S. patent application No. 62/312,863, filed Mar. 24, 2016, the disclosure of which is incorporated herein by reference in its entirety.

BACKGROUND

Wall-mounted control devices, such as standard mechanical switches (e.g., traditional toggle switches, decorator paddle switches, etc.), load control devices (e.g., dimmers, electronic switches, sensor switches, timers, etc.), and system control devices (e.g., remote control devices, keypads, sensors, etc.) may be mounted in electrical wallboxes. Typically, such wall-mounted control devices may comprise a mounting yoke adapted to be connected to the wallbox, for instance via one or more mounting screws. Additionally, a wall-mounted control device may include a faceplate that may be attached to the mounting yoke (e.g., via one or more faceplate screws) for enclosing the electrical wallbox and hiding the mounting yoke from view. However, if the electrical wallbox is not installed correctly, for example such that the wallbox is misaligned with respect to a surface of adjoining structure, such as wallboard, when the faceplate is attached to the yoke it may be angularly offset relative to the surface of the structure, and/or tightening the faceplate screws may cause the outer surface of the faceplate to become warped. One or both of these conditions may cause a gap to form between the faceplate and the wall, which may be aesthetically displeasing.

SUMMARY

As described herein, a mounting frame may be configured as a self-adjusting mounting frame that biases itself against a surface of structure. In an example implementation, the mounting frame may be configured as a component of a remote control device, such that a control unit and a faceplate are releasably attachable to the mounting frame.

The remote control device may be configured to control one or more electrical loads, such as lighting loads, and/or load control devices. The remote control device may be configured to be mounted over the actuator of an existing mechanical switch that, for example, may control whether power is delivered to the one or more electrical loads. The remote control device may be configured to transmit one or more commands for controlling the electrical loads and/or load control devices via wireless communication.

The mounting frame may be configured to be attached to the yoke of the existing mechanical switch. The existing mechanical switch may be installed in an electrical wallbox. The mounting frame may include one or more biasing members that are configured to bias a rear surface of the mounting frame against a surface of structure, such as a wallboard surface that surrounds the wallbox. The one or more biasing members may be configured to bias the rear surface of the mounting frame against an outer surface of the structure as the mounting frame is fastened to the yoke of the existing mechanical switch.

In an example configuration, the mounting frame may include two biasing members. Each biasing member may include an attachment portion and a pair of resilient spring arms that suspend the attachment portion relative to a perimeter wall of the mounting frame. Each attachment portion may define an aperture that is configured to receive a faceplate screw to secure the attachment portion against the yoke of the mechanical switch. The biasing members may be configured such that the respective attachment portions are spaced further from the rear surface of the mounting frame than locations where the spring arms extend from the mounting frame.

In another example implementation, the mounting frame may be configured as a component of a faceplate assembly that includes a faceplate. The faceplate assembly may be configured such that the faceplate may be removably attached to the mounting frame. The mounting frame may be configured to be attached to a yoke of an installed wall-mounted control device, such as a mechanical switch or a dimmer switch. The mounting frame may include one or more biasing members that are configured to bias a rear surface of the mounting frame against a surface of structure, such as a wallboard surface that surrounds a wallbox in which the wall-mounted control device is installed. The one or more biasing members may be configured to bias the rear surface of the mounting frame against an outer surface of the structure as the mounting frame is fastened to the yoke of the wall-mounted control device.

In an example configuration, the mounting frame may include two biasing members. Each biasing member may include an attachment portion and a pair of resilient spring arms that suspend the attachment portion relative to a perimeter wall of the mounting frame. Each attachment portion may define an aperture that is configured to receive a faceplate screw to secure the attachment portion against the yoke of the wall-mounted control device. The biasing members may be configured such that the respective attachment portions are spaced further from the rear surface of the mounting frame than locations where the spring arms extend from the mounting frame.

DETAILED DESCRIPTION

Figure 1:
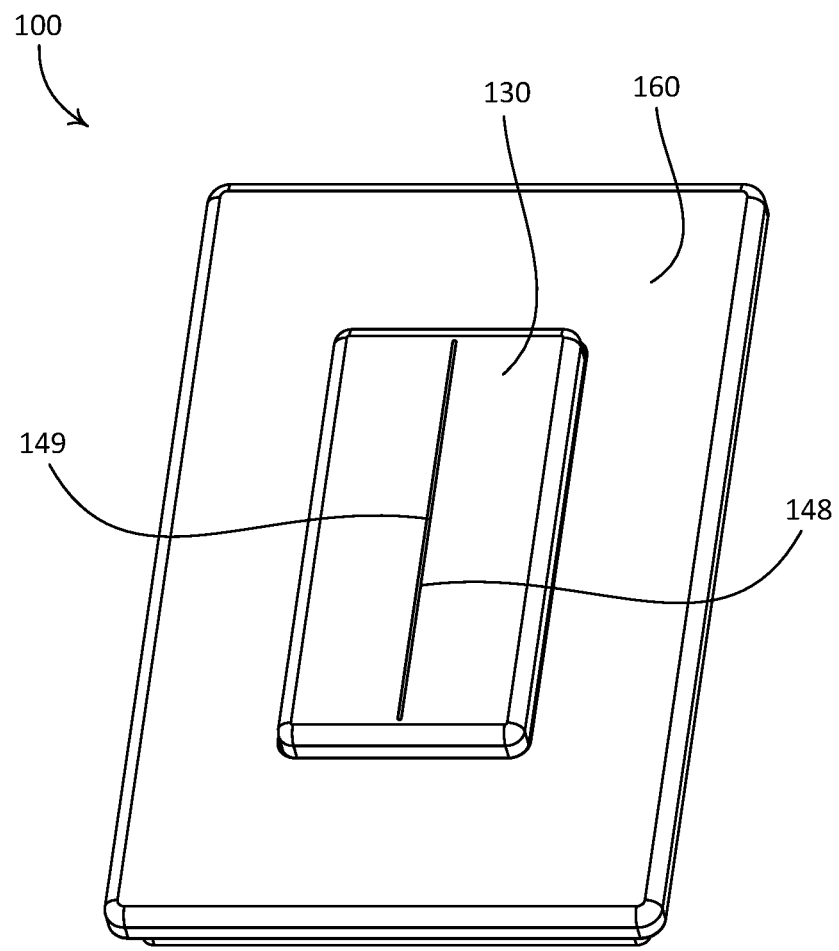
FIG. 1 is a perspective view of an example remote control device.
Figure 2:
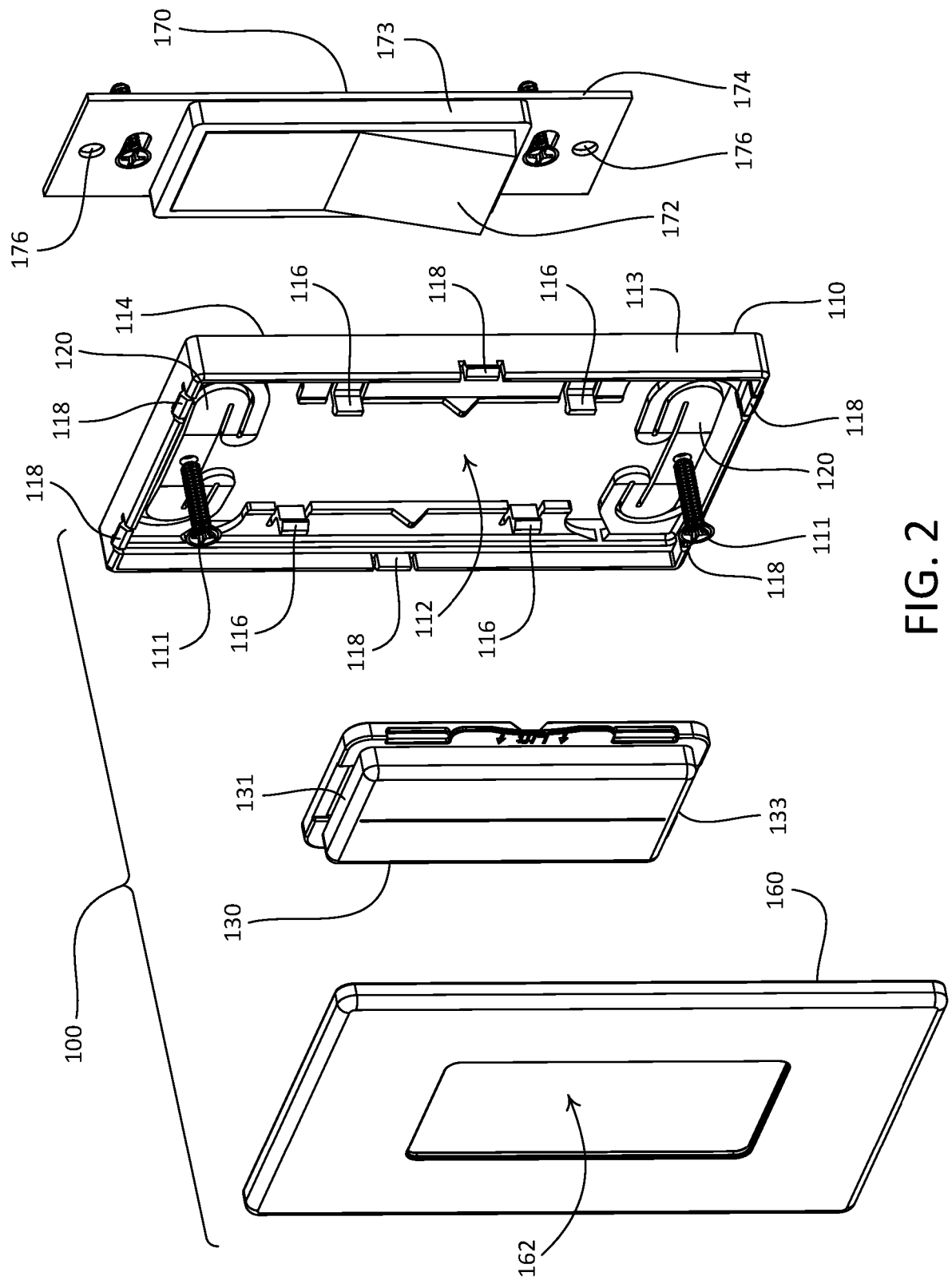
FIG. 2 is an exploded view of the example remote control device illustrated in FIG. 1.

FIGS. 1 and 2 depict an example remote control device 100 that may be installed in a load control system, such as a lighting control system. The load control system may include a mechanical switch 170 that may be in place prior to installation of the remote control device 100, for example pre-existing in the load control system. As shown, the mechanical switch 170 may be a standard decorator paddle switch. The load control system may further include one or more electrical loads, such as lighting loads. The mechanical switch 170 may be coupled in series electrical connection between an alternating current (AC) power source and the one or more electrical loads. The mechanical switch 170 may include an actuator 172 that may be actuated to turn on and/or turn off, the one or more electrical loads. The mechanical switch 170 may include a yoke 174 that enables mounting of the mechanical switch 170 to a structure. For example, the yoke 174 of the illustrated mechanical switch 170 may be fastened to a single-gang wallbox that is installed in an opening of a wall.

The load control system may further include a load control device that is electrically connected to the one or more electrical loads. The load control device may include a load control circuit for controlling the intensity of one or more of the electrical loads between a low end intensity (e.g., approximately 1%) and a high-end intensity (e.g., approximately 100%), and may include a wireless communication circuit. In an example implementation, the load control device may be a standalone dimmer switch that is electrically connected to the one or more electrical loads. In another example implementation, each of the one more electrical loads may include a respective integrated load control circuit and wireless communication circuit, such that each electrical load includes a corresponding load control device that is configured for wireless communication. It should be appreciated that the load control system is not limited to the example load control devices described herein.

As shown, the example remote control device 100 may include a mounting frame 110, a control unit 130, and a faceplate 160. The mounting frame 110 may alternatively be referred to as an adapter. Prior to installation of the remote control device 100, a pre-existing faceplate (not shown) may be removed from the mechanical switch 170, for instance by removing faceplate screws (not shown) from corresponding faceplate screw holes 176 in the yoke 174. The mounting frame 110 may be configured to be attached to the yoke 174 of the mechanical switch 170. For example, the mounting frame 110 may be secured to the yoke 174 using fasteners, such as screws 111 (e.g., faceplate screws) that are installed into the faceplate screw holes 176 in the yoke 174.

As shown, the mounting frame 110 may define an opening 112 that extends therethrough. The opening 112 may be configured to receive a portion of the mechanical switch 170 that may include, for example, the actuator 172 and a bezel 173 that surrounds a perimeter of the actuator 172. The mounting frame 110 may include a perimeter wall 113. As shown, the perimeter wall 113 may have a rectangular shape defined by a first end wall 115, an opposed second end wall 117, and opposed side walls 119 that extend from the first end wall 115 to the second end wall 117. In accordance with the illustrated orientation of the mounting frame 110, the first end wall 115 may be referred to as an upper wall at an upper end of the mounting frame 110 and the second end wall 117 may be referred to as a lower end wall at a lower end of the mounting frame 110. As shown, the mounting frame 110 may define four corners. In accordance with the illustrated orientation of the mounting frame 110, the corners defined where the side walls 119 meet the first end wall 115 may be referred to as upper corners of the mounting frame 110 and the corners defined where the side walls 119 meet the second end wall 117 may be referred to as lower corners of the mounting frame 110. As shown, the perimeter wall 113 of the mounting frame 110 may define a rear surface 114 that is configured to abut a surface of a structure to which the mechanical switch 170 is installed, such as an outer surface of wallboard that surrounds a wallbox in which the mechanical switch 170 is installed. The mounting frame 110 may be made of any suitable material, such as plastic. It should be appreciated that the mounting frame 110 is not limited to the illustrated rectangular geometry, and that the mounting frame may alternatively be configured with other suitable geometries.

The mounting frame 110 may be configured to enable removable attachment of the control unit 130 to the mounting frame 110. For example, the mounting frame 110 may define one or more attachment members that are configured to engage with complementary features of the control unit 130. As shown, the mounting frame 110 may define one or more resilient snap fit connectors 116 that are configured to engage with complementary features of the control unit 130. The mounting frame 110 may be configured to enable removable attachment of the faceplate 160 to the mounting frame 110. For example, the mounting frame 110 may define one or more attachment members that are configured to engage with complementary features of the faceplate 160. As shown, the mounting frame 110 may define one or more resilient snap fit connectors 118 that are configured to engage with complementary features of the faceplate 160.

Figure 6:
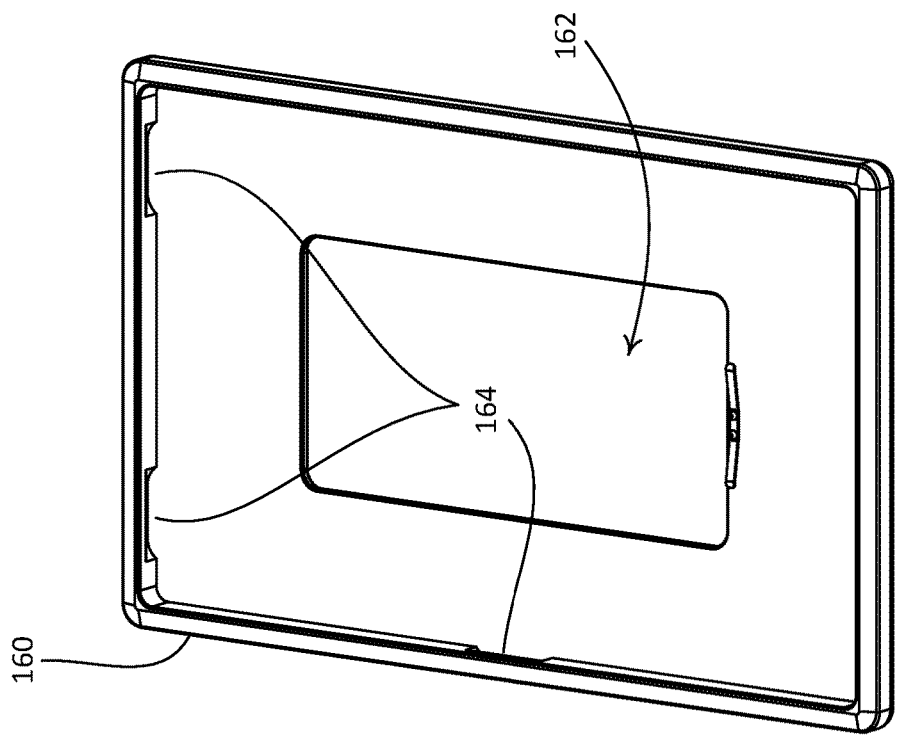
FIG. 6 is a rear perspective view of a faceplate component of the example remote control device illustrated in FIG. 2.

The faceplate 160 may define a front surface 161 and an opposed rear surface 163. The front surface 161 may alternatively be referred to as an outer surface of the faceplate 160, and the rear surface 163 may alternatively be referred to as an inner surface of the faceplate 160. The faceplate 160 may define an opening 162 that extends therethrough and that is configured to receive a portion of the control unit 130, such that the control unit 130 protrudes proud of the faceplate 160 when the remote control device 100 is in an assembled configuration. As shown, the faceplate 160 may define recessed ledges 164 (e.g., as shown in FIG. 6) that are configured to engage with corresponding ones of the snap fit connectors 118 of the mounting frame 110, to releasably attach the faceplate 160 to the mounting frame 110. The faceplate 160 may be made of any suitable material, such as plastic.

Figure 3A:
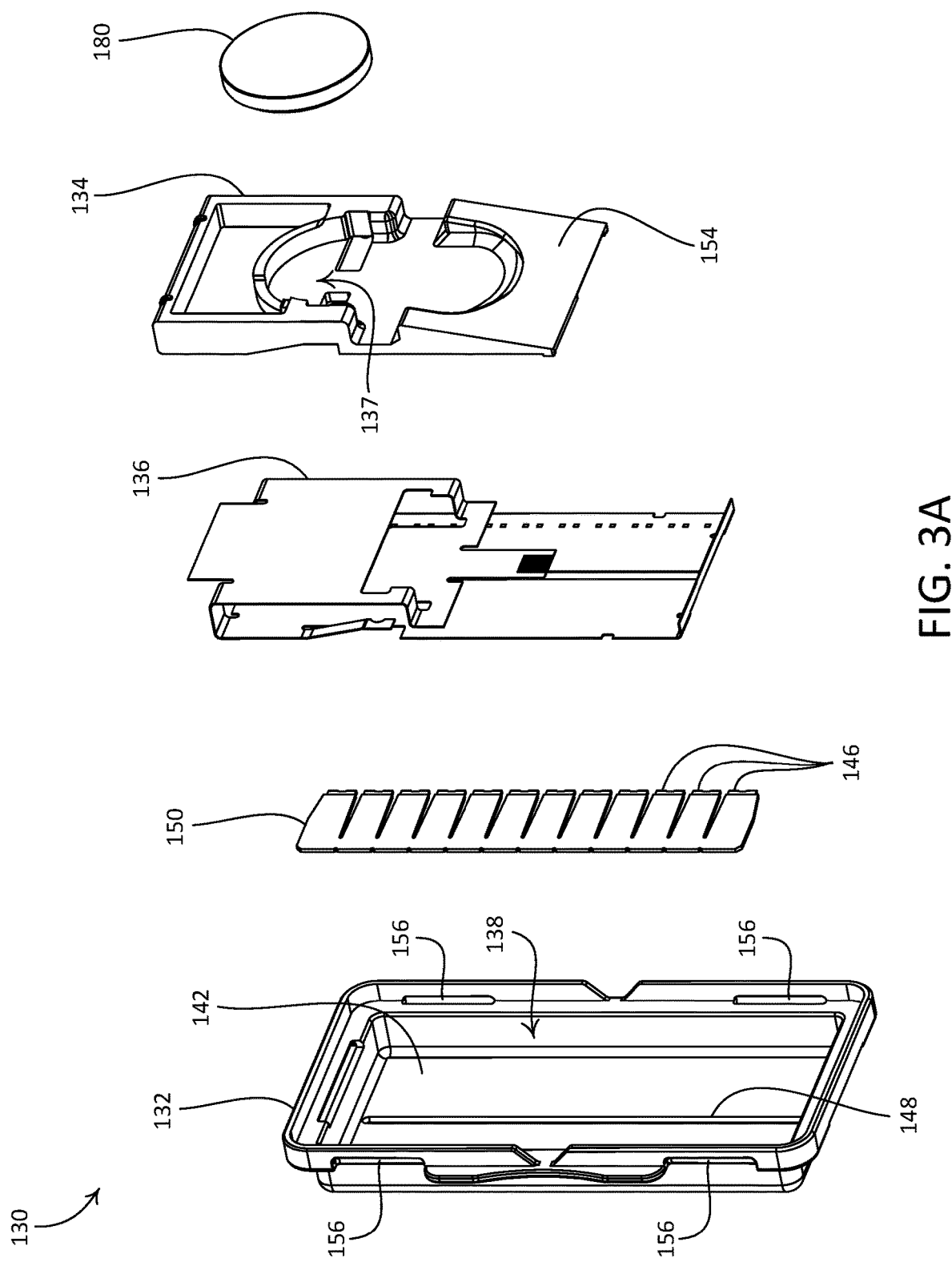
FIG. 3A is an exploded rear perspective view of a control unit component of the example remote control device illustrated in FIG. 2.
Figure 3B:
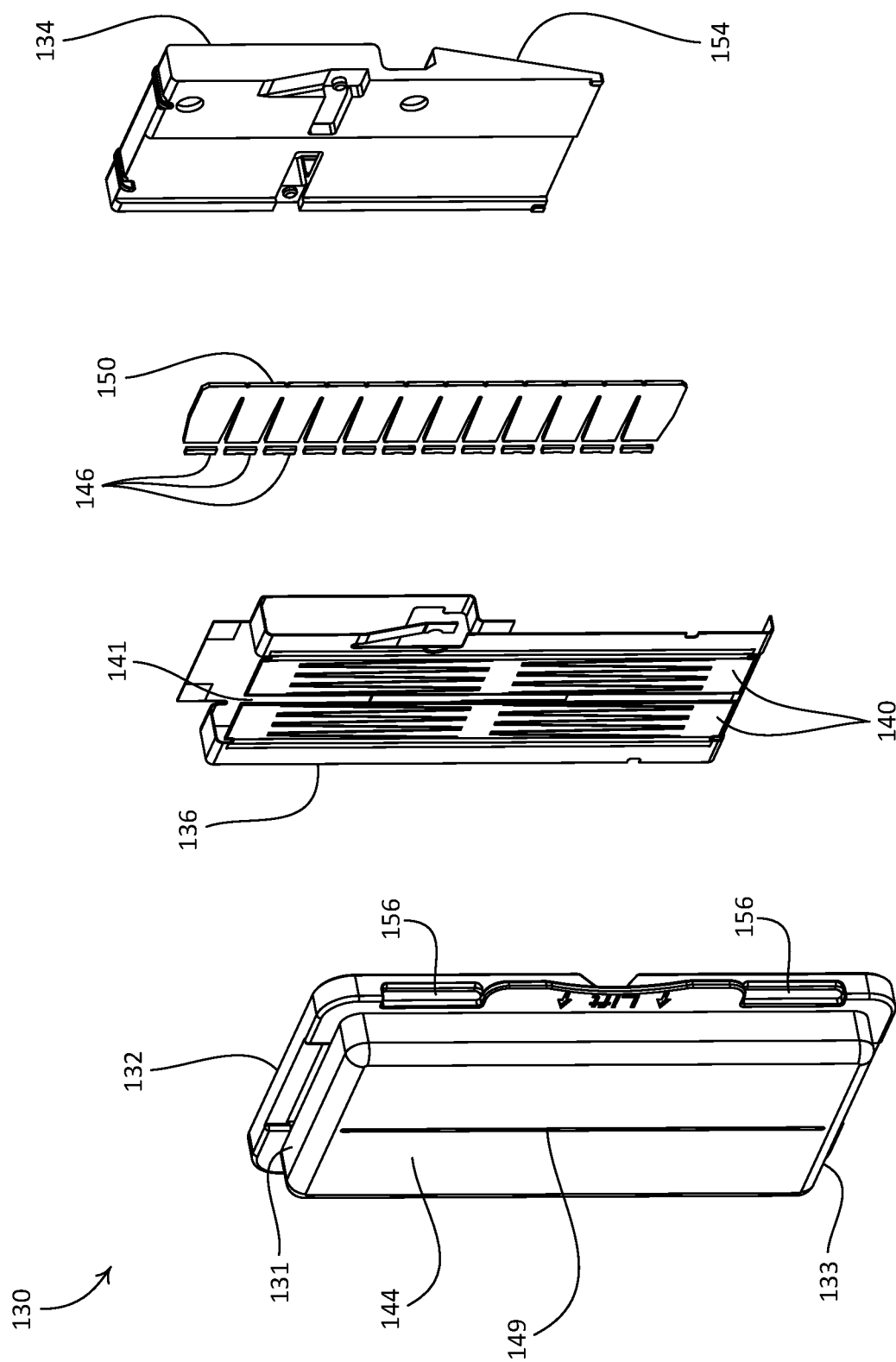
FIG. 3B is an exploded front perspective view of the control unit control unit component of the example remote control device illustrated in FIG. 2.

As shown in FIGS. 3A and 3B, the control unit 130 may include a cover 132, an insert 134 that is configured to be received in the cover 132, and a flexible circuit board 136 that may be configured to be wrapped around a portion of the insert 134. The cover 132 and the insert 134 may be made of any suitable material, such as plastic. The illustrated control unit 130 is rectangular in shape and is elongate between a first end 131 and an opposed second end 133. It should be appreciated that the control unit 130 is not limited to the illustrated rectangular geometry, and that the control unit may alternatively be configured with other suitable geometries. In accordance with the illustrated orientation of the control unit 130, the first end 131 may be referred to as an upper end of the control unit 130 and the second end 133 may be referred to as a lower end of the control unit 130. The first and second ends 131, 133 of the control unit 130 may also be referred to as first and second ends of the cover 132, respectively. The cover 132 may define a void 138 that is configured to receive the insert 134 with the flexible circuit board 136 wrapped around the insert 134 in an attached position. The cover 132 may define an inner surface 142 and an opposed outer surface 144. The outer surface 144 of the cover 132 may alternatively be referred to as a front surface of the cover 132, and more generally as an outer surface of the control unit 130.

Figure 5:
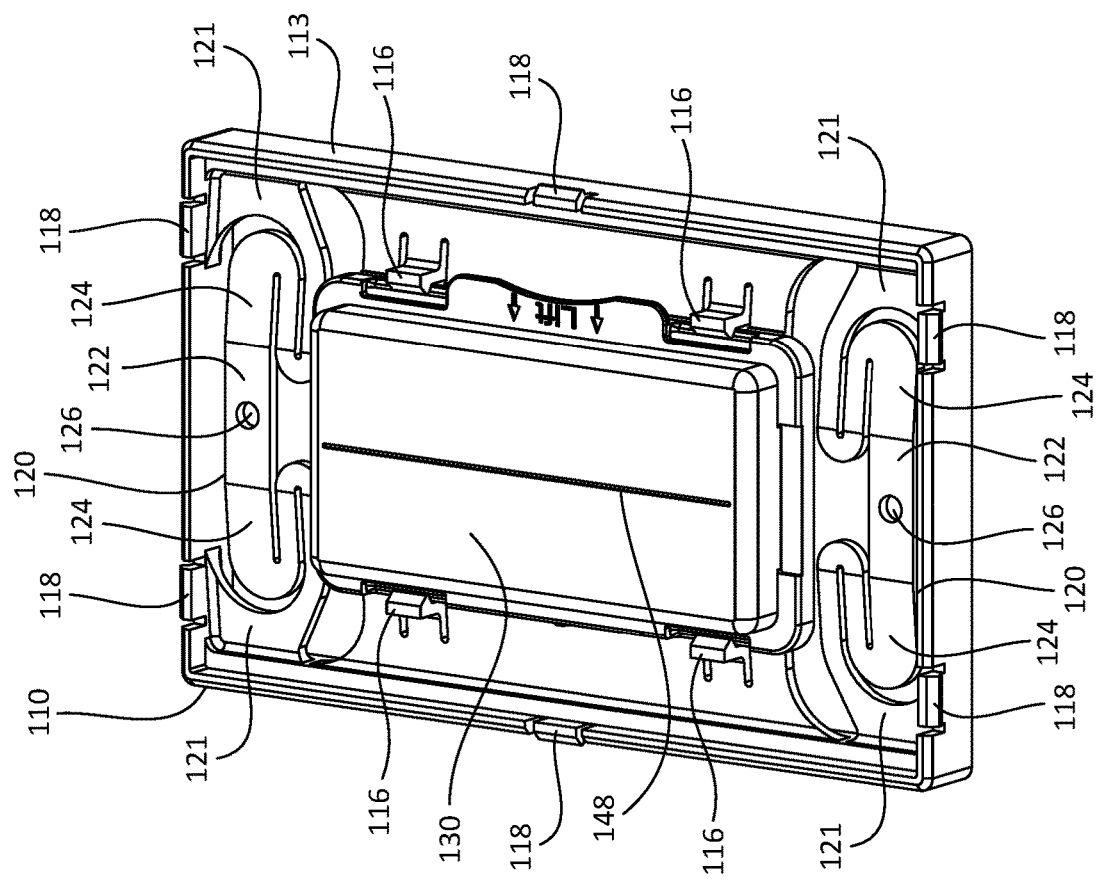
FIG. 5 is a front perspective view of a mounting frame component and the control unit component of the example remote control device illustrated in FIG. 2.
Figure 7:
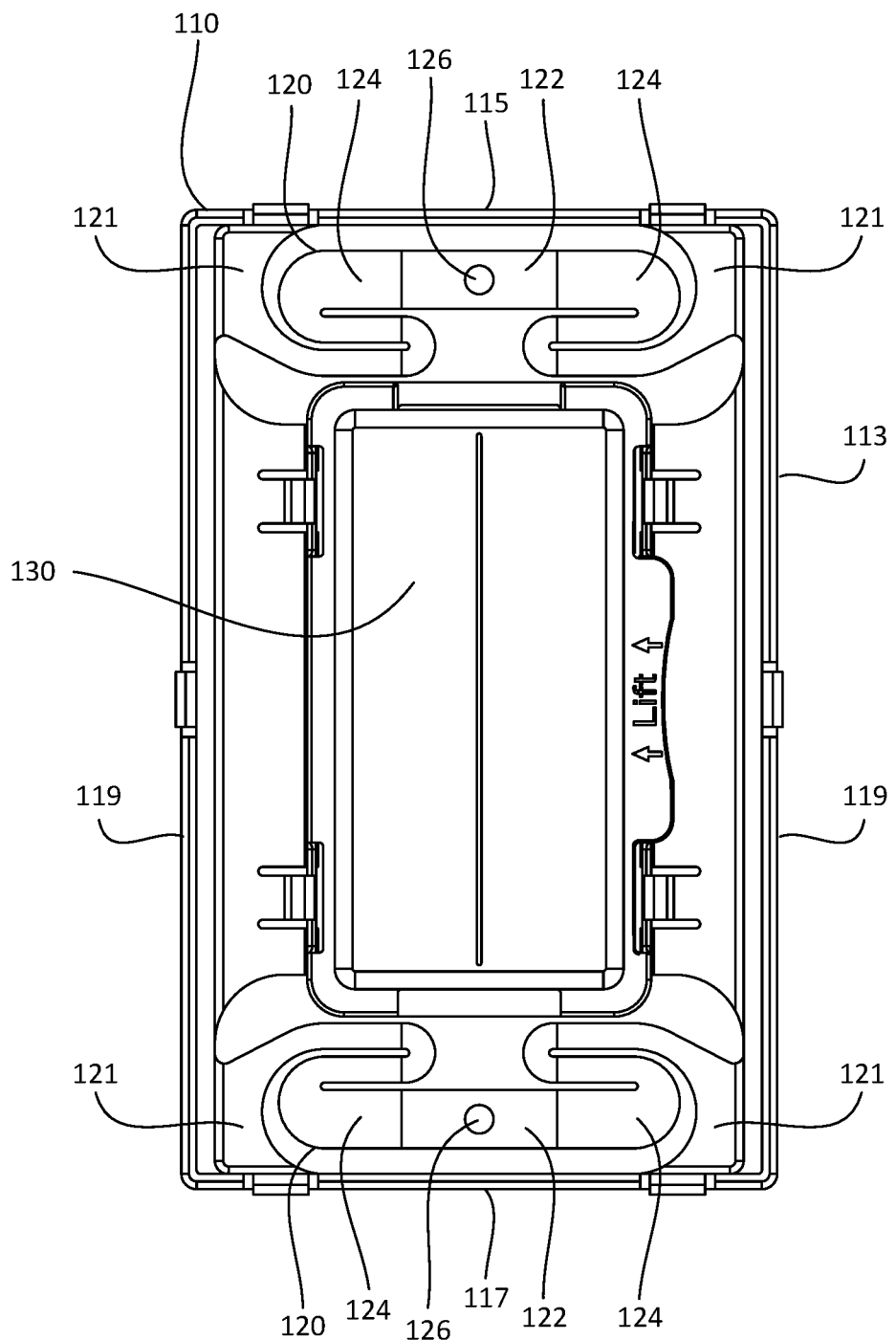
FIG. 7 is a front view of the mounting frame and control unit components of the example remote control device illustrated in FIG. 5.

As shown in FIGS. 5 and 7, the mounting frame 110 may be configured to bias the rear surface 114 of the mounting frame 110 against a surface of a structure to which the mechanical switch 170 is installed, such as an outer surface of wallboard that surrounds a wallbox in which the mechanical switch 170 is installed. For example, as shown, the mounting frame 110 defines a pair of biasing members 120 that are configured to bias the rear surface 114 of the mounting frame 110 against the surface of the structure as mounting frame 110 is fastened to the yoke 174 of the mechanical switch 170 via attachment of the biasing members 120 to the yoke 174.

Each biasing member 120 may include an attachment portion 122 that is suspended from the mounting frame 110 by a pair of resilient spring arms 124, such that the attachment portion 122 is spaced forward from the rear surface 114 of the mounting frame 110. The attachment portions 122 of the illustrated biasing members define a flat, rectangular plate shape. The attachment portion 122 of each biasing member 120 may be configured for attachment to the yoke 174 of the mechanical switch 170. For example, as shown each attachment portion 122 defines an aperture 126 that extends therethrough and that is configured to receive a corresponding one of the screws 111.

In accordance with the illustrated configuration, the spring arms 124 are configured to suspend the attachment portions 122 of the biasing members 120 relative to the perimeter wall 113 of the mounting frame 110. As shown, the mounting frame 110 defines two pairs of tabs 121 that extend inward from the perimeter wall 113 into the opening 112. The illustrated mounting frame 110 includes a first pair of tabs 121 located at the upper corners of the mounting frame 110 and a second pair of tabs 121 located at the lower corners of the mounting frame 110. Each spring arm 124 extends from the attachment portion 122 of a respective one of the biasing members 120 to a corresponding one of the tabs 121 located in the corners of the mounting frame 110. In this regard, the four corners of perimeter wall 113 of the mounting frame 110 are effectively independently suspended relative to each other by the attachment portions 122.

In accordance with the illustrated configuration of the biasing members 120, the spring arms 124 may define respective curved geometries (e.g., S-shaped) between the tabs 121 and the attachment portions 122. The biasing members 120 may be configured such that the attachment portions 122 are spaced further from the rear surface 114 of the mounting frame 110 than are the respective locations where the tabs 121 extend from the perimeter wall 113. For example, as shown the tabs 121 and the spring arms 124 are sloped upward relative to the rear surface 114 of the mounting frame 110 between the perimeter wall 113 and the attachment portions 122. More specifically, the tabs 121 and spring arms 124 slope continually upward with increasing distance from the corresponding side walls 119. As shown, the biasing members 120 are configured such that the respective attachment portions 122 are equally spaced from the rear surface 114 of the mounting frame 110. It should be appreciated that the mounting frame 110 is not limited to the illustrated biasing member geometry, and that one or more portions of the biasing members 120, such as one or more of the tabs 121, the attachment portions 122, and the spring arms 124, may alternatively be configured with other suitable geometries.

In an example process of attaching the mounting frame 110 to the yoke 174 of the mechanical switch 170, screws 111 may be driven through the apertures 126 of the attachment portions 122 and into the faceplate screw holes 176 of the yoke 174. As the screws 111 are driven in, the heads of screws 111 may pull the attachment portions 122 of the biasing members 120 toward the structure. As one or more portions of the rear surface 114 of the mounting frame 110 make contact with a surface of the structure, the spring arms 124 of the biasing members 120 may deflect, such that forces are applied to the perimeter wall 113 via the tabs 121, thereby biasing the rear surface 114 of the mounting frame 110 against the outer surface of the structure.

The biasing forces applied by the spring arms 124 may allow the mounting frame 110 to self-adjust during installation to compensate for installation defects of the mechanical switch 170 (e.g., improper alignment of the wallbox in the structure, etc.), abnormalities of the structure itself (e.g., unevenness of the surface of the structure), or the like. Operation of the biasing members 120 may allow substantially an entirety of the rear surface 114 of the mounting frame 110 to make contact with the surface of the structure, such that gaps between the mounting frame 110 and the surface of the structure are minimized or prevented.

The control unit 130 may define a control interface, such as a capacitive touch user interface, that is configured to receive inputs, such as gestures, from a user of the remote control device 100. For example, the flexible circuit board 136 may include one or more capacitive touch regions, or surfaces. As shown, the flexible circuit board 136 includes a linear capacitive touch surface 140 that faces the inner surface 142 of the cover 132 when the flexible circuit board 136 is wrapped around the insert 134 and disposed in the void 138. The capacitive touch surface 140 may be configured to detect touches along an x axis, a y axis, or both an x and y axis.

The control unit 130 may further include a control circuit (not shown) and a wireless communication circuit (not shown). The control circuit and the wireless communication circuit may be mounted to the flexible circuit board 136, for example. The control circuit may be in electrical communication with the capacitive touch surface 140, and the wireless communication circuit may be in electrical communication with the control circuit. The flexible circuit board 136 may be configured to wrap around the insert 134 such that the capacitive touch surface 140 is spaced from the control circuit, the wireless communication circuit, and/or other "noisy" circuitry of the flexible circuit board 136 along a direction that extends perpendicular to the outer surface 144 of the cover 132. This may improve operational efficiency of the capacitive touch surface 140.

The control unit 130 may be configured to translate one or more inputs applied via the capacitive touch surface 140 into respective control signals that may be used to control a load control device of a load control system. For example, the control circuit may be configured to receive signals from the capacitive touch surface 140 that correspond to inputs, such as gestures, applied to the capacitive touch surface 140 by a user of the remote control device 100. The control circuit may be configured to interpret the signals into commands that the user desires the control unit 130 to cause to be executed.

The control circuit may be configured to recognize a plurality of signals received from the capacitive touch surface 140 that correspond to user inputs or gestures applied via the capacitive touch surface 140. The control unit 130 may be configured to provide a visual indication associated with inputs and/or gestures received by the capacitive touch surface 140. For example, as shown, the control unit 130 may further include a plurality of light emitting diodes (LEDs) 146 that are configured to provide the visual indication. In accordance with the illustrated control unit 130, the plurality of LEDs 146 are arranged in a linear array that extends between the first and second ends 131, 133 of the control unit 130, and may be attached to the flexible circuit board 136 approximate to an outer edge thereof. The cover 132 may define an opening that allows light from one or more of the LEDs 146 to be emitted outward from an interior of the cover 132. For example, as shown, the cover 132 defines a narrow slot 148 that extends between the first and second 131, 133 of the cover 132. The cover 132 may include a light bar 149 (e.g., a light diffuser) that is disposed in the slot 148. The capacitive touch surface 140 may define a gap 141, for example approximately midway between opposed sides of the flexible circuit board 136 or near a side thereof. The control unit may further include a light guide 150 that may be configured to diffuse light emitted from the LEDs 146 through the gap 141 at respective locations along the slot 148. The light guide 150 may comprise light guide film, for example. It should be appreciated that the control unit 130 is not limited to the illustrated array of LEDs 146 and/or the illustrated geometry of the slot 148.

The cover 132, the capacitive touch surface 140, the plurality of LEDs 146, and the slot 148 may cooperate with one another to define a capacitive touch interface of the control unit 130, and more generally of the remote control device 100. The capacitive touch interface may be configured to provide a visual indication of a command issued by the remote control device 100. For example, the capacitive touch interface may be configured to, upon receiving a gesture indicative of a command to change an amount of power delivered to an electrical load, such as a command to dim a lighting load of a lighting control system, indicate the amount of power delivered to the electrical load by temporarily illuminating a number of the plurality of LEDs 146 that corresponds with the desired amount of power (e.g., the desired dimming level of the lighting load). In such an example, the control circuit may be configured to cause the LEDs 146 to be illuminated simultaneously, to illuminate sequentially with some or little overlap before fading, or to otherwise illuminate as desired.

Figure 4:
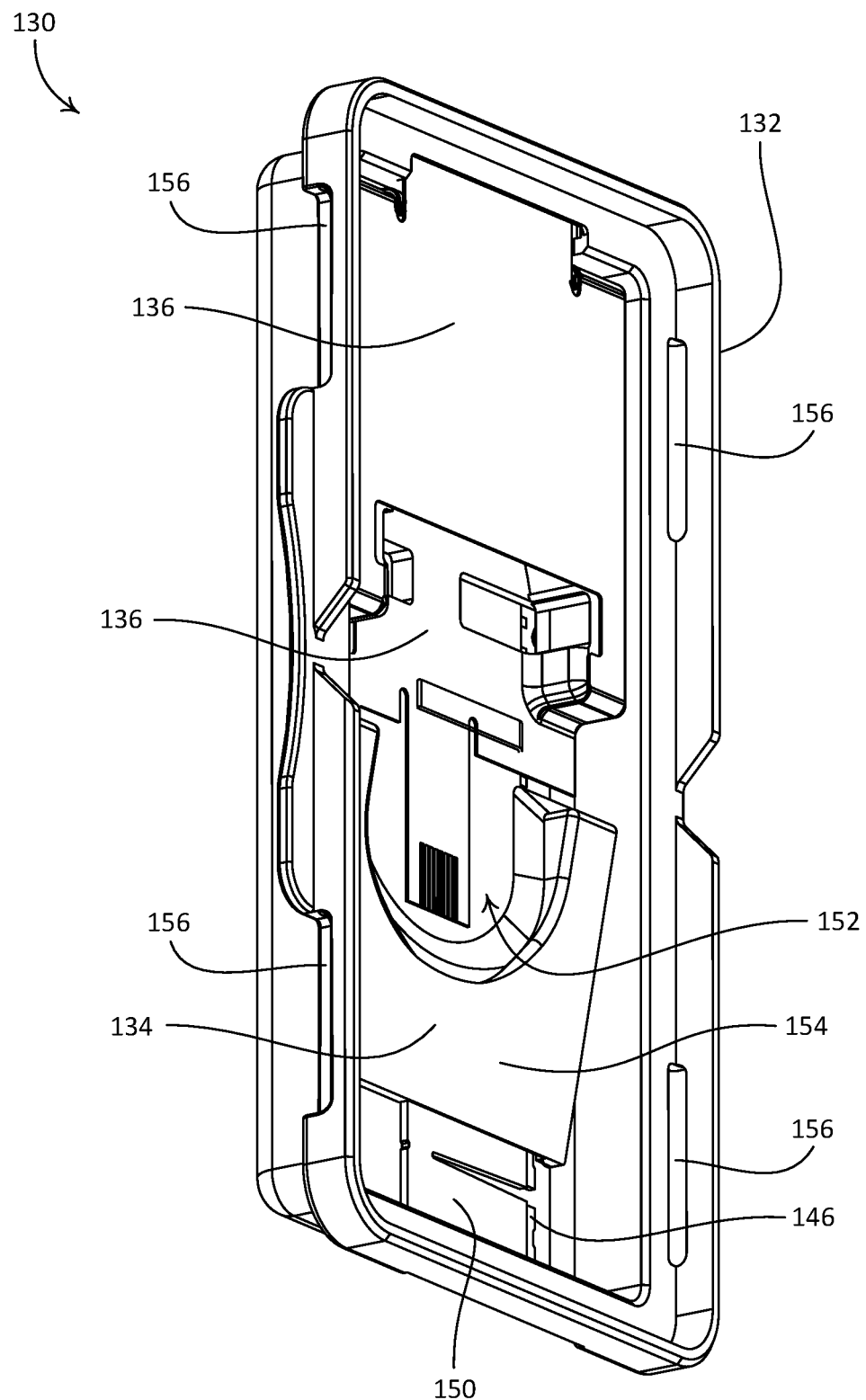
FIG. 4 is a rear perspective view of the control unit component illustrated in FIGS. 3A and 3B, in an assembled configuration.

The control unit 130 may be configured to be attached to the mounting frame 110 in multiple orientations, for example in accordance with a position of the actuator 172 of the mechanical switch 170. For example, the insert 134 may be configured to, when received in the void 138 in the cover 132, define a recess 152 (e.g., as shown in FIG. 4) that is configured to receive a portion of the actuator 172 of the mechanical switch 170 when the control unit 130 is attached to the mounting frame 110. As shown, the insert 134 may define a sloped surface 154 that at least partially defines the recess 152. When the control unit 130 is attached to the mounting frame 110, the control unit 130 may be oriented such that the recess 152 is positioned over, and receives, a portion of the actuator 172 that protrudes from the mechanical switch 170. To illustrate, if the actuator 172 is in a first position, such that the lower portion of the actuator 172 protrudes, the control unit 130 may be oriented such that the recess 152 is positioned to receive the lower portion of the actuator 172. Alternatively, if the actuator 172 is in a second position, such that the upper portion of the actuator 172 protrudes, the control unit 130 may be oriented such that the recess 152 is positioned to receive the upper portion of the actuator 172. In this regard, the control unit 130 may be configured to be attached to the mounting frame 110 in at least first and second orientations. As shown, the cover 132 of the control unit 130 may define slots 156 that are configured to receive and engage with corresponding ones of the snap fit connectors 116 of the mounting frame 110, to releasably attach the control unit 130 to the mounting frame 110. FIG. 5 illustrates the mounting frame 110 with the control unit 130 attached thereto.

The control circuit may be configured to cause the wireless communication circuit to transmit respective commands that correspond to interpreted gestures received at the capacitive touch surface 140. For example, the remote control device 100 may be operable to transmit wireless signals, for example radio frequency (RF) signals, to a load control device, one or more electrical loads, and/or a central processor of a load control system. The remote control device 100 may be associated with the load control device and the one or more electrical loads during a configuration procedure of the load control system. An example of a configuration procedure for associating a remote control device with a load control device is described in greater detail in commonly-assigned U.S. Patent Publication No. 2008/0111491, published May 15, 2008, entitled "Radio-Frequency Lighting Control System," the entire disclosure of which is hereby incorporated by reference.

The illustrated control unit 130 may be battery-powered. For example, as shown, the insert 134 may define a battery compartment 137 that is configured to retain a battery, for instance the illustrated coin cell battery 180, such that the battery is placed in electrical communication with the flexible circuit board 136, for instance to power the capacitive touch surface 140, the control circuit, the wireless communication circuit, and/or other circuitry of the control unit 130. Alternatively, the control unit 130 may be configured to derive power from a power source connected to the mechanical switch 170, such as source of AC power for example. The faceplate 160 may be configured to store one or more spare batteries 180, for example in a void defined between an inner surface of the faceplate 160 and the mounting frame 110.

Figure 8C:
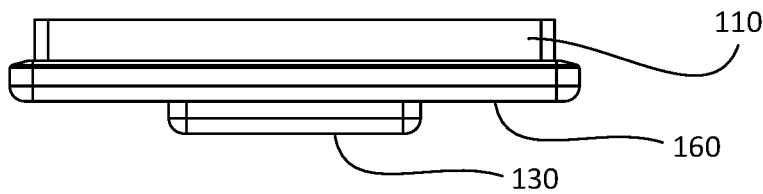
FIG. 8C is a top view of the example remote control device illustrated in FIG. 1.
Figure 8A:
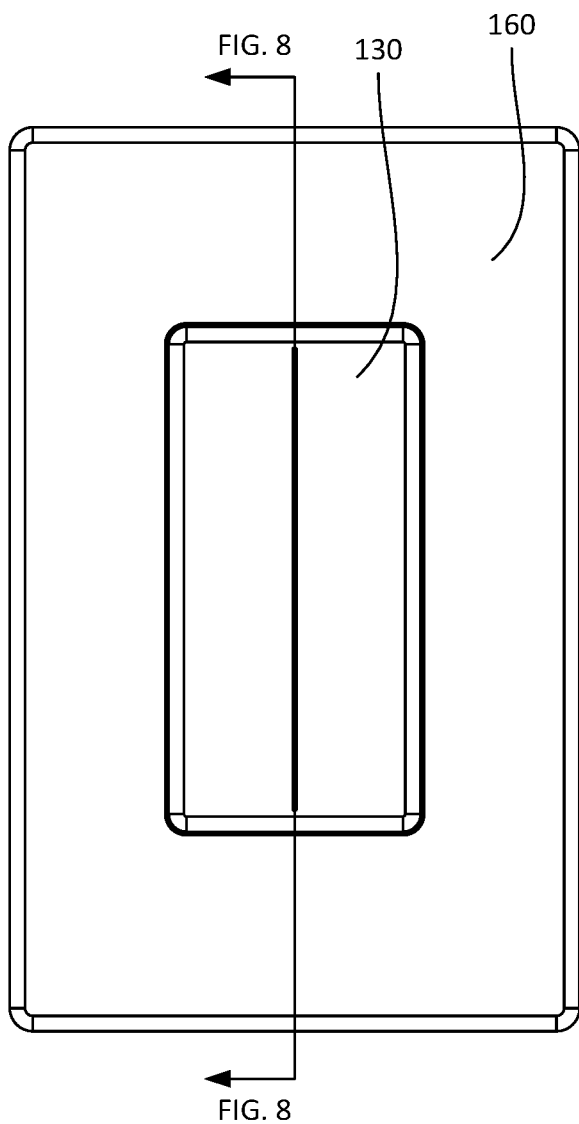
FIG. 8A is a front view of the example remote control device illustrated in FIG. 1.
Figure 8B:
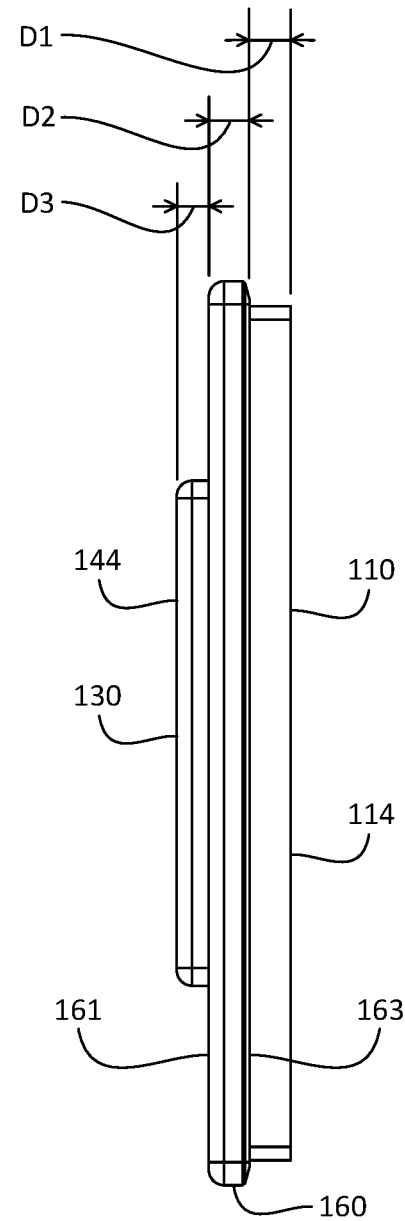
FIG. 8B is a side view of the example remote control device illustrated in FIG. 1.
Figure 9:
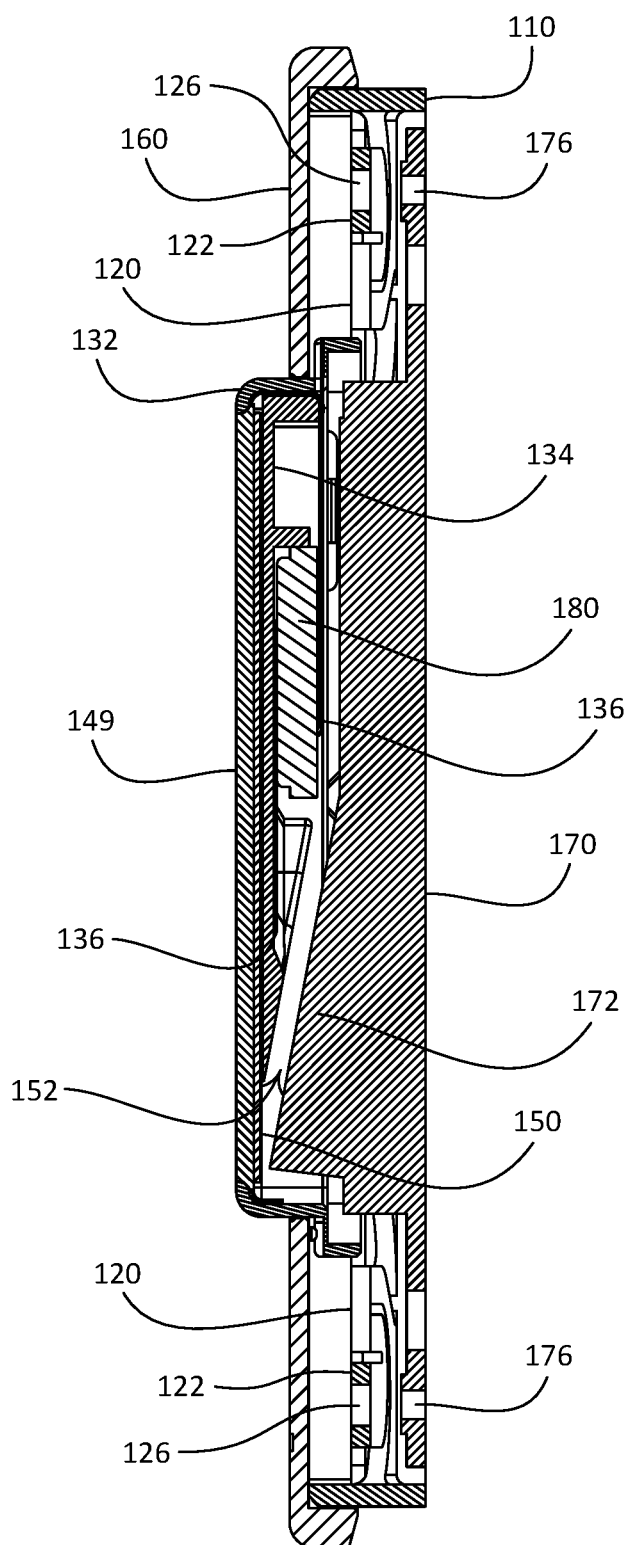
FIG. 9 is a side section view of the example remote control device illustrated in FIG. 1.

Referring now to FIGS. 8A-8C, the mounting frame 110, the control unit 130, and/or the faceplate 160 may be configured so as to be staggered relative to a surface of a structure to which the mechanical switch 170 is installed, such as a wallboard surface that surrounds a wallbox in which the mechanical switch 170 is installed. For example, when the mounting frame 110 is attached to the yoke 174 of the mechanical switch 170 and the control unit 130 and the faceplate 160 are attached to the mounting frame 110, the rear surface 163 of the faceplate 160 may be spaced from the rear surface 114 of the mounting frame 110 that abuts a structural surface (e.g., wallboard surface) through a first distance D1 such that the faceplate 160 is spaced from the structural surface. Additionally, the front surface 161 of the faceplate 160 may be spaced from the rear surface 163 of the faceplate 160 through a second distance D2, and the outer surface 144 of the control unit 130 may be spaced from the front surface 161 of the faceplate 160 through a third distance D3.

As shown, one or more components of the remote control device 100 (e.g., the mounting frame 110, the control unit 130, and/or the faceplate 160) may be configured such that the first distance D1, the second distance D2, and the third distance D3 may be substantially equal to each other. However it should be appreciated that one or more of the mounting frame 110, the control unit 130, and/or the faceplate 160 may be otherwise configured such that one or more of the first, second, and third distances D1, D2, D3 are different from each other. For example, if the remote control device 100 were alternatively configured to be attached to the yoke of a standard single pole single throw (SPST) maintained mechanical switch, such that the control unit would be configured to partially receive the toggle actuator of the switch, one or both of the first distance D1 and the second distance D2 may be longer. Additionally, if the remote control device 100 were alternatively configured to be mounted over a wall-mounted product other than a mechanical switch, such as over a dimmer switch or an electrical receptacle, one or both of the first distance D1 and the second distance D2 may be shorter.

In an alternative implementation, the mounting frame 110 may alternatively be provided as a component of a faceplate assembly that may include, for example, the mounting frame 110 and the faceplate 160. The components of the faceplate assembly may be configured, for example, in accordance with those of the illustrated remote control device 100, with the control unit 130 omitted. In accordance with such an implementation, the mounting frame 110 may be configured to be attached to a yoke of an installed wall-mounted control device, such as a mechanical switch, a dimmer switch, or the like. The mounting frame of the faceplate assembly may include one or more biasing members that are configured to bias a rear surface of the mounting frame against a surface of structure, such as a wallboard surface that surrounds a wallbox in which a wall-mounted control device is installed. For example, the mounting frame of the faceplate assembly may include a pair of biasing members 120 as illustrated and described herein. However, one or more other features of the mounting frame of the faceplate assembly may be alternatively configured. For example, the opening of the mounting frame may be similarly or differently configured to receive a control interface of an installed wall-mounted control device (e.g., the control interface of the switch device illustrated in U.S. Pat. No. 4,835,343 entitled "Two Piece Face Plate for Wall Box Mounted Device"). In this regard, the wall-mounted control device may define the control interface. Additionally, such a mounting frame may be configured such that the snap fit connectors 116 omitted.

It should be appreciated that the mounting frame 110 is not limited to the configuration illustrated and described herein, and that the mounting frame may alternatively be configured with other suitable geometries. For example, the mounting frame may alternatively be configured such that the perimeter wall is sized to be mounted over an installed light switch without removing the faceplate. In such a configuration, the perimeter wall may be dimensioned such that the mounting plate fits over the faceplate of the installed light switch. During installation, the faceplate screws of the installed light switch could be removed, and screws 111 could be used to secure the mounting frame to the yoke of the installed light switch without removing the faceplate, such that the faceplate of the installed light switch is disposed between the mechanical switch and the mounting frame. Additionally, it should be appreciated that the mounting frame may be alternatively configured to allow releasable attachment of control units other than the control unit 130, and that the faceplate 160 may be alternatively configured to allow releasable attachment of control units thereto.

It should further be appreciated that the example remote control device 100 illustrated and described herein may provide a simple retrofit solution for an existing switched control system, and may ease the installation of a load control system or enhance an existing load control system installation. A load control system that integrates the remote control device 100 may provide energy savings and/or advanced control features, for example without requiring any electrical re-wiring and/or without requiring the replacement of any existing mechanical switches.

It should further still be appreciated that load control systems into which the example remote control device 100 may be integrated are not limited to the example load control devices and/or electrical loads described above. For example, load control systems into which the remote control device 100 may be integrated may include one or more of: a dimming ballast for driving a gas-discharge lamp; a light-emitting diode (LED) driver for driving an LED light source; a dimming circuit for controlling the intensity of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in load control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; hydraulic valves for use in one or more radiators of a radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and the like.

What is claimed is:

1. A remote control device that is configured for use in a load control system having a load control device, the load control device configured to control an amount of power delivered to an electrical load that is electrically connected to the load control device, the remote control device comprising:
   a mounting frame that is configured to be attached to a yoke of a mechanical switch installed in a wallbox, wherein the mechanical switch controls whether power is delivered to the electrical load;
   a control unit that is configured to be attached to the mounting frame, the control unit comprising a control interface and a wireless communication circuit, the control unit configured to translate a user input from the control interface into a control signal that controls the load control device, the control unit further configured to cause the wireless communication circuit to transmit the control signal; and a faceplate that is configured to be attached to the mounting frame, the faceplate having an opening that is configured to receive at least a portion of the control interface, wherein the mounting frame comprises a biasing member that extends inward from a perimeter wall of the mounting frame, the biasing member configured to bias a rear surface of the mounting frame against an outer surface of a structure that surrounds the wallbox, and wherein the biasing member comprises an attachment portion that is suspended from the perimeter wall of the mounting frame, and wherein the attachment portion defines an aperture that extends therethrough; and wherein the aperture is configured to receive a faceplate screw that causes the attachment portion to move toward the outer surface of the structure, thereby causing the biasing member to bias the rear surface of the mounting frame against the outer surface of the structure.

2. The remote control device of claim 1, wherein the biasing member is configured to bias the rear surface of the mounting frame against the outer surface of the structure as the mounting frame is fastened to the yoke of the mechanical switch.

3. The remote control device of claim 2, wherein the biasing member comprises a pair of resilient spring arms that suspend the attachment portion relative to the perimeter wall of the mounting frame, and wherein the faceplate screw is configured to secure the attachment portion against the yoke of the mechanical switch.

4. The remote control device of claim 3, wherein the mounting frame comprises a pair of tabs that extend inward from the perimeter wall, and wherein each spring arm extends from the attachment portion to a respective one of the pair of tabs.

5. The remote control device of claim 4, wherein the biasing member is configured such that the attachment portion is spaced further from the rear surface of the mounting frame than respective locations where the tabs extend from the perimeter wall.

6. The remote control device of claim 5, wherein the biasing member is a first biasing member, and wherein the mounting frame further comprises a second resilient biasing member that is configured to cooperate with the first biasing member to bias the rear surface of the mounting frame against the outer surface of the structure.

7. The remote control device of claim 6, wherein the first biasing member is located at an upper end of the perimeter wall and the second biasing member is located at a lower end of the perimeter wall.

8. The remote control device of claim 5, wherein the spring arms define respective curved geometries between the tabs and the attachment portion.

9. A mounting frame that is configured to be attached to an installed mechanical switch that controls whether power is delivered to an electrical load, the mounting frame comprising:

first and second biasing members that are configured to bias a rear surface of the mounting frame against an outer surface of a structure to which the mechanical switch is mounted;

an opening that is configured to surround a bezel of the mechanical switch when the mounting frame is attached to a yoke of the mechanical switch; and a perimeter wall that defines the rear surface of the mounting frame, wherein the first biasing member comprises a first pair of resilient spring arms that extend from the perimeter wall into the opening and a first attachment portion that is suspended from the perimeter wall of the mounting frame, and wherein the first attachment portion defines a first aperture that extends therethrough, and wherein the second biasing member comprises a second pair of resilient spring arms that extend from the perimeter wall into the opening and a second attachment portion that is suspended from the perimeter wall of the mounting frame, and wherein the second attachment portion defines a second aperture that extends therethrough, and wherein the first and second apertures are configured to receive respective faceplate screws that secure the first and second attachment portions to the yoke of the mechanical switch, and wherein the first and second biasing members are configured such that, as the mounting frame is attached to the yoke of the mechanical switch, the faceplate screws cause the first and second attachment portions to move toward the outer surface of the structure, thereby causing the first and second pairs of spring arms to bias the rear surface of the mounting frame against the outer surface of the structure.

10. The mounting frame of claim 9, wherein the first attachment portion and the second attachment portion are spaced outward relative to the rear surface of the mounting frame.

11. The mounting frame of claim 9, wherein the first biasing member is configured to receive a first faceplate screw and the second biasing member is configured to receive a second faceplate screw, and wherein the first and second biasing members cooperate to bias the rear surface of the mounting frame against the outer surface of the structure as the first and second faceplate screws are driven into corresponding screw holes of the yoke of the mechanical switch.

12. A faceplate assembly comprising:

a mounting frame that is configured to be attached to a yoke of a wall-mounted control device installed in a wallbox, wherein the mounting frame comprises a first opening that is configured to surround a bezel of the wall-mounted control device when the mounting frame is attached to the yoke of the wall-mounted control device, and wherein the mounting frame comprises a perimeter wall that defines a rear surface of the mounting frame, and wherein the mounting frame comprises a biasing member that is configured to bias the rear surface of the mounting frame against an outer surface of a structure that surrounds the wallbox, and wherein the biasing member comprises an attachment portion that is suspended from the perimeter wall of the mounting frame, the attachment portion defining an aperture that extends therethrough;

a faceplate screw that is configured to be received by the aperture to secure the attachment portion against the yoke of the wall-mounted control device, wherein the faceplate screw causes the attachment portion to move toward the outer surface of the structure, thereby causing the biasing member to bias the rear surface of the mounting frame against the outer surface of the structure; and a faceplate that is configured to be attached to the mounting frame, the faceplate having a second opening that is configured to receive at least a portion of a control interface that controls an amount of power delivered to an electrical load.

13. The faceplate assembly of claim 12, wherein the control interface is defined by a control unit that is configured to be attached to the mounting frame, the control unit including a wireless communication circuit, the control unit configured to translate a user input received by the control interface into a control signal that controls the amount of power delivered to the electrical load, the control unit further configured to cause the wireless communication circuit to transmit the control signal.

14. The faceplate assembly of claim 13, wherein the wall-mounted control device comprises a mechanical switch.

15. The faceplate assembly of claim 12, wherein the wall-mounted control device defines the control interface.

16. The faceplate assembly of claim 12, wherein the biasing member is configured to bias the rear surface of the mounting frame against the outer surface of the structure as the mounting frame is fastened to the yoke of the wall-mounted control device.

17. The faceplate assembly of claim 12, wherein the biasing member comprises a pair of resilient spring arms that extend inward from the perimeter wall of the mounting frame and that suspend the attachment portion of the mounting frame relative to the perimeter wall.

18. The faceplate assembly of claim 12, wherein the biasing member is configured such that the attachment portion is spaced further from the rear surface than respective locations where the spring arms extend from the perimeter wall.

* * * * *